United States Patent
Casteel, Jr. et al.

(10) Patent No.: US 9,222,018 B1
(45) Date of Patent: Dec. 29, 2015

(54) TITANIUM NITRIDE HARD MASK AND ETCH RESIDUE REMOVAL

(71) Applicant: AIR PRODUCTS AND CHEMICALS, INC., Allentown, PA (US)

(72) Inventors: William Jack Casteel, Jr., Emmaus, PA (US); Seiji Inaoka, Macungie, PA (US); Wen Dar Liu, Chupei (TW); Tianniu Chen, Westford, MA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 14/642,831

(22) Filed: Mar. 10, 2015

Related U.S. Application Data

(60) Provisional application No. 62/028,539, filed on Jul. 24, 2014.

(51) Int. Cl.
  *C09K 13/00* (2006.01)
  *C09K 13/08* (2006.01)
  *H01L 21/311* (2006.01)

(52) U.S. Cl.
  CPC .......... *C09K 13/08* (2013.01); *H01L 21/31111* (2013.01)

(58) Field of Classification Search
  CPC ............... C09K 13/08; C11D 11/0047; H01L 2924/0002
  USPC ................................. 252/79.1, 79.3; 438/745
  See application file for complete search history.

(56) References Cited

U.S. PATENT DOCUMENTS

| 7,479,474 | B2 | 1/2009 | Cernat et al. |
| 2009/0131295 | A1 | 5/2009 | Cui |
| 2013/0157472 | A1 | 6/2013 | Cui |
| 2015/0175943 | A1* | 6/2015 | Casteel et al. ..... C11D 11/0047 |

FOREIGN PATENT DOCUMENTS

WO   2013101907 A1   7/2013

* cited by examiner

*Primary Examiner* — Roberts Culbert
(74) *Attorney, Agent, or Firm* — Lina Yang

(57) ABSTRACT

Formulations for stripping titanium nitride (TiN or TiNxOy; x=0 to 1.3 and y=0 to 2) hard mask and removing titanium nitride etch residue are low pH (<4) comprise a weakly coordinating anion having negative charge highly dispersed throughout its structure, amine salt buffer, a non-oxidizing trace metal ion, a non-ambient trace oxidizer, and the remaining being solvent selected from the group consisting of water, sulfolane, dimethyl sulfide, lactic acid, glycol, and mixtures thereof. The formulations contain no hydrogen peroxide, and are exposed to air. Bifluoride, corrosion inhibitors, surfactants may be added to the formulations. Systems and processes use the formulations for stripping titanium nitride hard mask and removing titanium nitride etch residue.

30 Claims, No Drawings

TITANIUM NITRIDE HARD MASK AND ETCH RESIDUE REMOVAL

CROSS REFERENCE TO RELATED PATENT APPLICATIONS

The present patent application claims the benefit of U.S. Provisional Patent Application Ser. No. 62/028,539 filed Jul. 24, 2014.

BACKGROUND OF THE INVENTION

As scaling continues to ever smaller feature sizes, integrated circuit (IC) reliability is an increasing concern in IC fabrication technology. The impact of trace interconnect failure mechanisms on device performance and reliability demand much more from integration schemes, interconnect materials, and processes. An optimal low-k dielectric material and its related deposition, pattern lithography, etching and cleaning are required to form dual-damascene interconnect patterns. A hard-mask scheme approach of interconnects-patterning wafer fabrication is the ability to transfer patterns into under layers with tightest optimal dimension control.

As technology nodes advance to nanotechnology, metal hard-mask materials such as TiN are used to gain better etching/removal selectivity, better pattern retention and profile control to the low-k materials during the pattern etching process.

Formulations have been developed to pullback or remove these types of metal hard-masks from substrates.

The following patents are representatives.

US2013/0157472 describes the formulations comprising Cl$^-$, or Br$^-$ an oxidizer and potentially a Cu corrosion inhibitor to clean substrates containing low-k dielectric and Cu and to etch a TiN or TiNxOy hardmask and tungsten. The formulation typically contains 6% hydrogen peroxide as the oxidizer and diglycolamine to adjust the pH to >7.

US 2009/0131295 A1 describes the removal of hard mask residues (typically TiF containing) after plasma etch from TiN at a pH of 1-8 using acidic or basic fluoride or bifluoride.

U.S. Pat. No. 7,479,474 B2 describes cleaning formulations comprising $H_2SiF_6$ or $HBF_4$ to reduce oxide etch in a substrate comprising low-K dielectric.

WO 2013/101907 A1 describes formulations comprising etchants including hexafluorosilicic acid and hexafluorotitanate, at least one oxidant including high valent metals, peroxide or high oxidation state species and at least one solvent.

BRIEF SUMMARY OF THE INVENTION

The present invention relates to composition, system and process for selectively etching hard mask layers and/or etch residues relative to metal conductor layers and low-k dielectric layers that are present. More specifically, the present invention relates to a composition, system and process for selectively etching a Titanium nitride hard mask and/or etch residues relative to tungsten, copper and low-k dielectric layers.

In one aspect, a composition for selectively removing titanium nitride (TiN or TiNxOy; where x=0 to 1.3 and y=0 to 2) from a semiconductor device comprising TiN or TiNxOy and a second material selected from the group consisting of Cu, W, low-k dielectric material, and combinations thereof, the composition comprising:
  a weakly coordinating anion having negative charge highly dispersed throughout its structure;
  an amine salt buffer;
  a non-oxidizing trace metal ion;
  a non-ambient trace oxidizer; and
  the remaining being solvent selected from the group consisting of water, sulfolane, dimethyl sulfide, lactic acid, glycol, and mixtures thereof;
  wherein
  the composition is hydrogen peroxide-free;
  the composition is exposed to air;
  the composition has a pH<4, preferably <2, more preferably <1.5; and
  the composition offers a removal selectivity of TiN or TiNxOy vs. the second material >1:1.

In another aspect, a system for selectively removing titanium nitride (TiN or TiNxOy, where x=0 to 1.3 and y=0 to 2) from a surface of a microelectronic device, comprising:
  the semiconductor device comprising TiN or TiNxOy and a second material selected from Cu, W, low-k dielectric material and combinations thereof,
  a composition for selectively removing the TiN or TiNxOy from the semiconductor device comprising:
  a weakly coordinating anion;
  an amine salt buffer;
  a non-oxidizing trace metal ion;
  a non-ambient trace oxidizer; and
  the remaining being solvent selected from the group consisting of water, sulfolane, dimethyl sulfide, lactic acid, glycol, and mixtures thereof;
  wherein
  the composition is hydrogen peroxide-free;
  the composition is exposed to air;
  the composition has a pH<4, preferably <2, more preferably <1.5; and
  the composition offers a removal selectivity of TiN or TiNxOy vs. the second material >1:1.
  and
  wherein
  TiN or TiNxOy is in direct contact with the composition and the TiN or TiNxOy is not in direct in contact with W if the second material is W.

In yet another aspect, a process of selectively removing titanium nitride (TiN or TiNxOy, where x=0 to 1.3 and y=0 to 2) comprising:
  providing a semiconductor device comprising TiN or TiNxOy and a second material selected from Cu, W, low-k dielectric material;
  contacting the semiconductor device with a composition comprising:
  a weakly coordinating anion;
  an amine salt buffer;
  a non-oxidizing trace metal ion;
  a non-ambient trace oxidizer; and
  the remaining being solvent selected from the group consisting of water, sulfolane, dimethyl sulfide, lactic acid, glycol, and mixtures thereof;
  wherein
  the composition is hydrogen peroxide-free;
  the composition is exposed to air; and
  the composition has a pH<4, preferably <2, more preferably <1.5;
  and
  selectively removing TiN or TiNxOy;
  wherein the TiN or TiNxOy is in direct contact with the composition and the TiN or TiNxOy is not in direct in contact with W if the second material is W; and removal selectivity of TiN or TiNxOy vs. the second material is >1:1.

The weakly coordinating anion includes but is not limited to p-toluenesulfonate ($C_7H_8SO_3^-$), sulfate ($SO_4^{2-}$), nitrate ($NO_3^-$), triflate ($CF_3SO_3^-$), fluorosulfate, perfluorosulfonates ($R_fSO_3^-$; $R_f$ is a perfluoroalkylgroup from C1 to C4), perfluorosulfonimides; (($R_f)_2NSO_2^-$; where $R_f$ is a perfluoroalkylgroup from C1 to C4), hexafluorosilicate ($SiF_6^{2-}$), hexafluorotitanate ($TiF_6^{2-}$), tetrafluoroborate ($BF_4^-$), hexafluorophosphate ($PF_6^-$), hexafluoroantimonate ($SbF_6^-$), perfluoroalkylaluminates (($R_fO)_4Al^-$, $R_f$ is a perfluoroalkyl group), and combinations thereof.

The amine salt buffer includes but is not limited to ammonium chloride;

ammonium bisulfate; ammonium phosphates; ammonium oxalate; ammonium perfluorosulfonates; ammonium tetrafluoroborate; ammonium hexafluorotitanate; ammonium hexafluorosilicate; ammonium salts of organic acid selected from ammonium citrate, ammonium acetate, ammonium lactate; and combinations thereof;

wherein the ammonium having a form of $N(R^1R^2R^3R^4)^+$;
wherein $R^1$, $R^2$, $R^3$, $R^4$ is independently selected from the group consisting of H, $CH_3$, $C_2H_5$, and $C_3H_7$.

The non-oxidizing trace metal ion includes but is not limited to Fe(II) ion, Cu(I) ion, Cu(II) ion, Co(II) ion, Cr(II) ion, Mn(II) ion and Ni(II) ion.

A non-ambient trace oxidizer includes but is not limited to Fe(III) in any form, Ce(IV) in any form, Vanadium (V), Mn(V, VI or VII) compounds, Cr(V or VI) compounds, Cl(I, III or V) compounds, Br(I or III) compounds, and combinations thereof.

The composition may further comprise solvolyzing bifluoride, corrosion inhibitor, and surfactant.

Other aspects, features and embodiments of the invention will be more fully apparent from the ensuing disclosure and appended claims.

DETAILED DESCRIPTION OF THE INVENTION

In general, the present invention relates to compositions, systems and processes for selectively etching hard mask layers and/or photoresist etch residues relative to metal conductor layers and low-k dielectric layers that are present. Specifically, this invention describes compositions, systems and processes with good removal rate for titanium nitride hard mask material (TiN or TiNxOy, where x=0 to 1.3 and y=0 to 2), called TiN hard mask material for simplicity hereafter; without damage to the metal 1 layer (M1) (such as tungsten) and other M1 level components including low k dielectric materials and in some cases aluminum nitride dielectric layers Compositions, or formulations designed for the removal of titanium nitride hard mask materials (TiN or TiNxOy, where x=0 to 1.3 and y=0 to 2) after wafer patterning typically use hydrogen peroxide as an oxidant. The terms "formulation" and "composition" as used herein, are used interchangeably.

Chemistries involving hydrogen peroxide as an oxidizing agent for Titanium nitride hard mask removal have proven effective, but appear to be incompatible with tungsten metal in the M1 layer of the wafer. The formulations often etch tungsten even more readily than the desired TiN hard mask. When hydrogen peroxide is used as an oxidant under slightly basic conditions to solubilize the titanium nitride as titanium peroxide species, unfortunately the M1 level metal, such as tungsten, also readily forms soluble peroxides and is attacked by these chemistries.

The chemistry of this invention avoids the use of hydrogen peroxide. That is, this invention, more specifically, describes a new hydrogen peroxide-free, platform of strippers (formulations) for Titanium nitride hard mask removal on 28 nm wafers and smaller nodes. This aspect of the invention makes the chemistry much more compatible with tungsten.

Air at atmospheric conditions is an example of a mild ambient oxidizer. The term non-ambient oxidizer includes any oxidizer that is not air or oxygen in air.

Unless specified, air at atmospheric conditions is normally present during tool operation, a mild ambient oxidizer is considered be present for the formulations.

The invention uses a low pH aqueous formulation comprising a weakly coordinating anion, amine salt buffer, in the presence of air and non-oxidizing trace metal ion, to remove the titanium nitride hard mask without etching tungsten. Nor does this chemistry etch the TiN liner between the tungsten and low-k dielectric layers.

The formulations contain a weakly coordinating anion in either the acidic form or an amine substituted form. A weakly coordinating anion has negative charge highly dispersed throughout its structure and so is designed to stabilize and keep very reactive cations, such as those of dissolved titanium nitride, in aqueous formulation.

The weakly coordinating anion may include, but is not limited to, p-toluenesulfonate ($C_7H_8SO_3^-$), sulfate ($SO_4^{2-}$), nitrate ($NO_3^-$), triflate ($CF_3SO_3^-$), fluorosulfate, perfluorosulfonates ($R_fSO_3^-$; where $R_f$ is a perfluoroalkylgroup from C1 to C4), perfluorosulfonimides; (($R_f)_2NSO_2^-$; where $R_f$ is a perfluoroalkylgroup from C1 to C4), hexafluorosilicate ($SiF_6^{2-}$), hexafluorotitanate ($TiF_6^{2-}$), tetrafluoroborate ($BF_4^-$), hexafluorophosphate ($PF_6^-$), hexafluoroantimonate ($SbF_6^-$) and perfluoroalkylaluminates (($R_fO)_4Al^-$, where $R_f$ is a perfluoroalkyl group), and combinations thereof.

The amount of the weakly coordinating anion is in the range of 1-10 wt %, preferably 2-8 wt %, and more preferably 4-8 wt %

The formulations contain an amine salt buffer. The amine salt buffer may include, but is not limited to, ammonium chloride, ammonium bisulfate, ammonium phosphates, ammonium oxalate, ammonium perfluorosulfonates, ammonium tetrafluoroborate, ammonium hexafluorotitanate or ammonium hexafluorosilicate (which may be formed from ammonium hydroxide and hexafluorosilicic acid), or ammonium salts of organic acids, including but not limited to ammonium citrate, ammonium acetate, ammonium lactate, and combinations thereof.

By ammonium is meant a salt of any amine of the form $N(R^1R^2R^3R^4)^+$ where $R^1$, $R^2$, $R^3$, $R^4$ may all be the same or different or and may constitute H, $CH_3$, $C_2H_5$, $C_3H_7$.

The amount of the amine salt buffer is in the range of 0.5-10 wt %, preferably 1-10 wt % and more preferably 2-8 wt %.

The formulations contain non-oxidizing trace metal ions which can exist in multiple oxidation states, as oxidation catalysts.

The formulations are also exposed to ambient air.

The non-oxidizing trace metal ion in the presence of air serve to catalyze the action of air as an oxidant in this system. In the absence of these non-oxidizing trace metal ions, the air oxidation is a slow process, and thus the etch rate for Titanium nitride is slow, while at the same time the dissolved non-oxidizing trace metal ions do not accelerate the Titanium nitride etch rate in the absence of normally present air.

The non-oxidizing trace metal ions, also called oxidation catalysts, or redox active metal ions, may include, but are not limited to, Fe(II) ion, Cu(I) ion, Cu(II) ion, Co(II) ion, Cr(II) ion, Mn(II) ion and Ni(II) ion as components of stable aqueous formulations at low pH<4. Typically these components will be added as salts in the form of chlorides or sulfates, but other salts may be used or these components may be added from controlled etching of the target metals by the formulation.

The non-oxidizing trace metal ion as oxidation catalysts is used in amounts of <500 ppm, preferably <250 ppm, more preferably <100 ppm and most preferably <50 ppm.

The formulations contain a non-ambient trace oxidizer which includes, but is not limited to, Fe(III) in any form, such as Fe(III)Cl$_3$, FeF$_3$, FeCl$_2^+$, FeCl$_2^+$; Ce(IV) in any form, Vanadium (V), Mn(V, VI or VII) compounds, Cr(V or VI) compounds, Cl(I, III or V) compounds, Br(I or III) compounds, and combinations thereof.

The non-ambient trace oxidizer is used in amounts ranging from 5-200 ppm, preferably from 10-100 ppm and more preferably from 15-50 ppm.

The formulations also include a solvent. The solvent may include, but is not limited to water, sulfolane, dimethyl sulfide, lactic acid, glycols, such as propylene glycol and mixtures thereof.

The formulations may contain further solvolyzing bifluoride at quantities <4000 ppm, or <2000 ppm, or <500 ppm, depending on the stability of the oxide, e.g., TEOS layer, or other low-k dielectric layers.

The solvolyzing bifluoride may include, but is not limited to ammonium bifluoride, alkylammonium bifluoride or aqueous hydrogen fluoride itself.

The formulations may contain corrosion inhibitors to improve compatibility to other metals.

The corrosion inhibitor may include, but is not limited to benzotriazole and substituted benzotriazole, polyethyleneimine, catechol, cysteine and cystine derivatives, glycine, thiourea and thiobiuret, siloxane, aluminum chloride, aluminum fluoride, imidazole, triazole and boric acid.

The corrosion inhibitor is used in amounts of <10000 ppm, preferably <5000 ppm and more preferably <1000 ppm.

The formulations may also contain surfactants to improve wettability of wafer surfaces. Examples of surfactants include but are not limited to ammonium lauryl sulfate and a wide range of organic sulfates, including salts of p-toluene sulfate. The surfactant is typically used in quantities <1000 ppm, preferably <500 ppm and more preferably <100 ppm.

The formulations have low pH<4, and preferably <2 and more preferably below 1.5.

In addition to their high Titanium nitride hard mask etch rate and compatibility with tungsten of the M1 layer, one unique property of the formulations of this invention is that Titanium nitride etches much more slowly when it is galvanically coupled with tungsten. By galvanically coupled it is meant that the Titanium nitride and W are in direct contact with each other in the presence of an electrically conducting formulation containing dissolved ions such as those described herein. This aspect of the invention is extremely important, because it allows the formulations to rapidly remove a Titanium nitride hard mask without damaging the TiN liner that lies directly between the W and the low-k dielectric layers of a patterned wafer.

The formulations of this invention offer the following advantages.

1. High rates of Titanium nitride etch are observed at 70° C. and lower.
2. Aqueous solutions of the formulations are stable.
3. Low active fluoride containing formulations show low TEOS etch and patterned PDEMs 2.2 damage.
4. With low or essentially no etch of tungsten, W, is observed, so formulations of this platform are compatible with and may be used in cleaning the M1 layer.
5. The formulations do not damage the TiN liner between the tungsten and the low-k dielectric layers.

WORKING EXAMPLES

Aqueous formulations were prepared by blending the components as described in Tables 1A and 1B.

TABLE 1A

|  | assay | 71P wt. % | 75A wt. % | 75B wt. % | 75C wt. % | 75D wt. % | 75F wt. % |
| --- | --- | --- | --- | --- | --- | --- | --- |
| DIW | 100% | 68.35 | 68.344 | 67.75 | 68.55 | 68.5 | 69.5 |
| hexafluorosilicic acid | 25% | 23.3 | 23.3 | 23.3 | 23.3 | 23.3 | 23.3 |
| ammonium chloride | 100% | 3.5 | 3.5 | 3.5 | 3.5 | 3.5 | 3.5 |
| ammonium bifluoride | 10% | 1.5 | 1.5 | 2.1 | 1.3 | 1.5 | 1.5 |
| Copper (II) Chloride | 1000 ppm Cu (II) | 0.2 | 0.2 | 0.2 | 0.2 | 0.2 | 0.2 |
| Iron (II) chloride |  | 0 | 0 | 0 | 0 | 0 | 0 |
| Iron (III) chloride | 1000 ppm Fe | 2 | 2 | 2 | 2 | 2 | 2 |
| Nickel (II) Chloride | 1000 ppm Ni (II) | 0.15 | 0.15 | 0.15 | 0.15 | 0 | 0 |
| Aluminum Chloride | 1% | 1 | 1 | 1 | 1 | 1 | 0 |
| Titanium Nitride | 100% | 0 | 0.006 | 0 | 0 | 0 | 0 |
| corrosion inhibitor | 1% | 0 | 0 | 0 | 0 | 0 | 0 |
| pH |  | ~1 | ~1 | ~1 | ~1 | ~1 | ~1 |

Non-oxidizing trace metal ions were added by either introducing known amounts of Fe(II)Cl$_2$, Fe(II)SO$_4$, Cu(II)Cl$_2$ or Cu(II)SO$_4$, Ni(II)Cl$_2$ or by dissolving known thicknesses of Cu metal coupons or carbon steel coupons.

Wafers of varying types of TiN, W, TEOS and typical ILD materials were immersed in the formulations with 500 rpm stirring and heating to 60 or 70° C. Immersion times were varied depending on the etch rates.

TABLE 1B

|  | assay | 71C wt. % | 71C2 wt. % | 71W wt. % | 71X wt. % | 71Y wt. % | 78A wt. % | 88A wt. % |
|---|---|---|---|---|---|---|---|---|
| DIW | 100% | 63.44 | 64 | 70.494 | 70.5 | 70.498 | 66.35 | 68.5 |
| hexafluorosilicic acid | 25% | 20 | 20 | 20 | 20 | 20 | 23.3 | 23.3 |
| ammonium chloride | 100% | 3.5 | 3.5 | 3.5 | 3.5 | 3.5 | 3.5 | 3.5 |
| ammonium bifluoride | 10% | 1.5 | 1.5 | 1.5 | 1.5 | 1.5 | 1.5 | 1.5 |
| Copper (II) Chloride | 1000 ppm Cu (II) | 0.06 | 0 | 0 | 0 | 0 | 0.2 | 0.2 |
| Iron (II) chloride |  | 0 | 0 | 0 | 0 | 0 | 0 | 3 |
| Iron (III) chloride | 1000 ppm Fe | 10 | 10 | 2 | 2 | 2 | 2 | 0 |
| Nickel (II) Chloride | 1000 ppm Ni (II) | 1.5 | 0 | 1.5 | 1.5 | 1.5 | 0.15 | 0 |
| Aluminum Chloride | 1% | 0 | 1 | 1 | 1 | 1 | 1 | 0 |
| Titanium Nitride | 100% | 0 | 0 | 0.006 | 0.001 | 0.002 | 0 | 0 |
| corrosion inhibitor | 1% | 0 | 0 | 0 | 0 | 0 | 2 | 0 |
| pH |  | ~1 | ~1 | ~1 | ~1 | ~1 | ~1 | ~1 |

Etch rates for metals were determined by determining film thicknesses before and after the etch process by sheet resistivity on a CDE RESMAP. Etch rates for the ILD and TEOS were measured by before and after thicknesses on a SCI FilmTeK Ellipsometer.

TiN Stripping studies at 70° C. using the formulations were carried out in the following examples and comparative examples.

Example 1

Non Stoichiometric Fe(III)Cl$_3$ and Cu(II) Chloride

By non-stoichiometric, it is meant that there is insufficient Fe(III) or Cu(II) to oxidize the TiN in more than 500 patterned wafers containing TiN hard masks. This is a typical minimum bath life requirement.

Formulation 71P contained 20 ppm Fe(III) and 2 ppm Cu(II). Table 2 has shown the etch rate data for formulation 71P in the presence of air.

TABLE 2

|  | 71P (t0) | 71P (t 2 hrs) | 71P (t 6 hrs) |
|---|---|---|---|
|  |  | Etch Rates (Å/min) |  |
| RIE TiN | >120 | >120 | >120 |
| W | 29 | 24 | 8 |
| ILD | 8 | 7 | 9 |

The rate data has shown that a formulation containing non-stoichiometric amounts of Fe(III)Cl$_3$ and Cu(II) chloride were capable of stripping plasma etched TiN at >100 Å/min, while retaining ~10:1 etch/removal selectivity over W and ILD etching. The removal selectivity of TiN over W/ILD is defined as the ratio of the etch/removal rate of TiN over the etch/removal rate of W/ILD.

In this example, the level of Fe(III) and Cu(II), in the absence of air were only sufficient to give a bath life of ~75 wafers. This example showed that the baseline chemistry starts with a relatively high W etch rate of 30 Å/min, but equilibrates to a W etch rate near 10 Å/min.

Example 2

Cu(II) Chloride and Iron (II) Chloride, No Added Non-Ambient Trace Oxidant

Table 3 has shown the etch data for formulation 88A in the presence of air.

The formulation contained no added non-ambient trace oxidant. The formulation had 30 ppm Iron (II) chloride and 2 ppm Cu(II) chloride as the only added trace metals. Air was present in the system.

TABLE 3

|  | 88A (t0) | 88A (t 2 hrs) | 88A (t 4 hrs) |
|---|---|---|---|
|  |  | Etch Rates (Å/min) |  |
| RIE TiN | >101 | >101 | >99 |
| W | 13 | 13 | 13 |
| ILD |  |  | 10 |

The data in Table 3 has shown that the formulations could perform well to selectively etch TiN over W and ILD materials without any added non-ambient trace oxidant provided air, copper (II) and Fe(II) were present.

Example 3

No Ni(II) and Al(II)

Table 4 has shown the etch data for formulation 75F in the presence of air.

Formulation 75F was similar to 71P but had no Ni and no Al.

TABLE 4

|  | 75F (t0) | 75F (t 1 hrs) | 75F (t 2 hrs) | 75F (t 4 hrs) |
|---|---|---|---|---|
|  |  | Etch Rates (Å/min) |  |  |
| RIE PVD TiN | >96 | >96 | >96 | 67 |
| W | 30 | 13 | 13 | 15 |
| ILD | 11 | 12 | 8 | 9 |

The etch data in Table 4 has shown that 71P formulation with Ni(II) and Al removed, had comparable performance to the original 71P formulation in terms of TiN etch rate and selectivity toward W and ILD, but that some loss of TiN etch was observed with time in the absence of these metals.

Example 4

Stoichiometric Non-Ambient Trace Oxidant in the Form of Fe(III)

This was a comparative example. Formulation 71C contained stoichiometric $FeCl_3$. Formulation 71C also contained Cu(II). Table 5 has shown the etch rate data for the formulation. Air was present.

TABLE 5

|  | 71C (0 hrs) Etch Rates (Å/min) |
|---|---|
| RIE PVD TiN | >100 |
| W | 185 |
| ILD | 7 |

The data in Table 5 has shown that when enough Fe(III) was added to dissolve the TiN from a minimum of 500 wafers, i.e., 100 ppm, the W etch rate became extremely high, relative to the TiN etch rate.

Thus, unlike the oxidants described in the prior art, Fe(III) cannot be used as a stoichiometric non-ambient trace oxidant in the applications where the removal selectivity of TiN vs. W is important.

Example 5

Stoichiometric Non-Ambient Oxidant, No Cu(II), No NI(II)

This was a comparative example. Formulation 71C2 contained stoichiometric non-ambient oxidant in the form of Fe(III), but no Cu(II) or NI(II).

Table 6 has shown the etch rate data for a formulation containing stoichiometric $FeCl_3$ for dissolving the TiN on 500 wafers. Air was present.

TABLE 6

|  | 71C2 (0 hrs) | 71C2 (2 hrs) | 71C2 (4 hrs) |
|---|---|---|---|
|  | Etch Rates (Å/min) | | |
| RIE PVD TiN | 136 | 153 | 150 |
| W | 130 | 93 | 73 |
| ILD | 7 | 6 | 9 |

The data in Table 6 has shown that when enough of the non-ambient oxidant, non-ambient trace oxidant Fe(III), was added to the formulation to dissolve the TiN from a minimum of 500 wafers, i.e., 100 ppm, the W etch rate became extremely high, relative to the TiN etch rate.

Thus, unlike the oxidants described in the prior art, Fe(III) again cannot be used as a stoichiometric non-ambient trace oxidant in the applications where the removal selectivity of TiN vs. W is important.

Example 6

Non-Stoichiometric Fe(III), Cu(II) with Excess TiN

This was a comparative example. Formulation 75A contained non-stoichiometric non-ambient trace oxidant in the form of Fe(III), and Cu(II). Air was present.

Table 7 has shown the etch rate data for formulation 75A. More specifically, Table 7 has shown what happened to the etch rate data over time when TiN equivalent to 300 wafers was added to the 71P formulation at $t_o$. $t_o$ was defined as when 65 ppm TiN and 20 ppm Fe(III) were present in the formulation. Air was present in the system.

TABLE 7

|  | 75A (t0) | 75A (t 2 hrs) | 75A (t 4 hrs) | 75A (t 8 hrs) |
|---|---|---|---|---|
|  | Etch Rates (Å/min) | | | |
| RIE PVD TiN | 55 | >90 | >110 | >90 |
| W | 2 | 9 | 13 | 5 |
| ILD | 10 | 6 | 8 | 15 |

The data in Table 7 has shown that when the 71P formulation containing significantly less non-ambient trace oxidant than TiN was present at $t_o$ (in this case 65 ppm TiN vs. 20 ppm Fe(III)), the initial TiN and W etch rates dropped, but in the presence of trace Cu(II) and air, these etch rates rapidly equilibrated back to the levels offered from 71P with high TiN etch rate and good removal selectivity towards W and ILD etch rate.

The combination of Fe(III) and Cu(II) was able to act as a catalyst for air oxidation in the TiN etching process. An added benefit of adding TiN to this formulation is that the initially somewhat high W etch rate in 71P is suppressed by reducing the Fe(III) in the formulation and allowing it to re-oxidize in the presence of air and trace Cu(II).

Example 7

Non-Stoichiometric Fe(III) with Excessive TiN, No Cu(II)

This was a comparative example. Formulation 71W contained non-stoichiometric non-ambient trace oxidant in the form of Fe(III), but no Cu(II).

Table 8 has shown the etch rate data for formulation 71W. More specifically, Table 8 has shown what happened to the etch rate data over time when excessive 65 ppm TiN equivalent to 300 wafers was added to the formulation 71P with 20 ppm Fe(III), but no Cu(II). Air was still present in this example.

TABLE 8

|  | 71W (t0) | 71W (t 2 hrs) | 71W (t 6 hrs) |
|---|---|---|---|
|  | Etch Rates (Å/min) | | |
| RIE PVD TiN | 2 | 3 | 7 |
| W | 0 | 1 | 1 |
| ILD | 9 | 9 | 6 |

The data in Table 8 has shown that when the 71P formulation containing significantly less non-ambient trace oxidant than TiN was present at $t_o$ (in this case 65 ppm TiN vs. 20 ppm Fe(III)), and no Cu(II) was present in formulation, the TiN etch process was effectively shut off, even in the presence of air.

Thus, the example has shown that excess TiN effectively reduces Fe(III) and in the absence of Cu(II), air does not rapidly re-oxidize to re-establish the TiN etch process.

Therefore, the example has shown that the catalytic system requires Fe(II/III) and Cu(II).

Example 8

Non-Stoichiometric Fe(III) with Low TiN, No Cu(II)

This was a comparative example. Formulation 71X contained non-stoichiometric non-ambient trace oxidant in the form of Fe(III), low level of TiN, no Cu(II).

Table 9 has shown the etch rate data for formulation 71X. More specifically, Table 9 has shown what happened to the etch rate of plasma treated TiN over time, when low level of 10 ppm TiN equivalent to only 50 wafers was added to formulation 71P with 20 ppm Fe(III), and no Cu(II). Air was still present in this example.

In this example the level of TiN dissolved in the formulation was less than the amount of $FeCl_3$ added to the formulation (10 ppm vs. 20 ppm). Even this small amount of TiN dissolution (equivalent to ~50 wafers) was sufficient to shut off the TiN etching process when no Cu(II) was present in the formulation.

TABLE 9

|  | 71W (t0) Etch Rates (Å/min) |
|---|---|
| RIE PVD TiN | 2 |

Thus, the example has shown that even substoichiometric levels of TiN effectively reduce Fe(III) and in the absence of Cu(II), air does not rapidly re-oxidize to re-establish the TiN etch process.

Therefore, this example has shown again that the catalytic system requires Fe(II/III) and Cu(II).

Example 9

Non-Stoichiometric Fe(III) with Equivalent Level of Ti, No Cu(II)

This was a comparative example. Formulation 71Y contained non-stoichiometric non-ambient trace oxidant in the form of Fe(III), with equivalent level of TiN, no Cu(II).

TABLE 10

|  | 71Y (0 hrs) | 71Y (1 hr) | 71Y (after overnight storage) |
|---|---|---|---|
|  |  | Etch Rates (Å/min) |  |
| RIE PVD TiN | 3 | 3 | 10 |
| W | 0 | 22 | 2 |
| ILD | 7 | — | 5 |

Table 10 has shown the etch rate data for formulation 71Y. More specifically, Table 10 has shown what happened to the etch rate of plasma treated TiN over time, when 20 ppm TiN equivalent to only 100 wafers was added to formulation 71P with 20 ppm Fe(III), and no Cu(II). Air was still present in this example.

In this example the level of TiN dissolved in the formulation was the same as the amount of $FeCl_3$ added to the formulation (20 ppm vs. 20 ppm). The data in Table 10 has shown that in the absence of Cu(II), the TiN etching was shut down once a comparable amount of TiN (20 ppm) was dissolved. Even though air was present the formulation, the formulation was unable to significantly etch TiN even after 20 hrs of storage under air.

Thus, the example has shown that in the absence of Cu(II), air does not rapidly re-oxidize to re-establish the TiN etch process.

Therefore, this example has shown again that the catalytic system requires Fe(II/III) and Cu(II).

Example 10

Non-Stoichiometric Fe(III), Cu(II), No Air

This was a comparative example. Formulation 75F contained non-stoichiometric non-ambient trace oxidant in the form of Fe(III), Cu(II).

Table 11 has shown the etch rate data for formulation 75F. More specifically, the data in Table 11 has shown the impact of removing air for the 71P-type formulation containing both Fe(III) and Cu(II) after reducing the Fe(III) with TiN and removing air from the system.

TABLE 11

|  | 75F (without air) Etch Rates (Å/min) | 75F (10 min air exposure) Etch Rates Å/min) |
|---|---|---|
| RIE PVD TiN | 10 | >70 |

The data in example 11 has shown that when air was removed from the reduced 71P system, the ability to etch RIE TiN remained very low even when the Fe(II/III) and Cu(II) catalytic system was present. The example also has shown that re-establishing the air flow, quickly re-establishes the TiN etch rate.

Thus, the example has shown that the catalytic system requires Fe(II/III) and Cu(II), air is also needed to rapidly re-oxidize to re-establish the TiN etch process.

Example 11

Higher HF Level

Formulation 75B containing higher HF level was used in this example.

Formulation 75B contained similar chemical constituents as 71P but with 50 more HF level: 1500 ppm (75B) vs. 1000 ppm (71P) ammonium bifluoride.

Table 12 has shown the etch rate data for formulation 75B.

TABLE 12

|  | 75B (t0) | 75B (t 2 hrs) | 75B (t 4 hrs) |
|---|---|---|---|
|  |  | Etch Rates (Å/min) |  |
| RIE PVD TiN | >100 | >85 | >90 |
| W | 19 | 9 | 13 |
| ILD | 14 | 14 | 14 |

The data in Table 12 has shown that a 50% increase in HF level from 1000 ppm to 1500 ppm in the formulation resulted in a small decrease in W etch rate, particularly near $t_o$. The ILD etch rate increased slightly over formulation 71P.

Example 12

Lower HF Level

Formulation 75C containing lower HF level was used in this example.

Formulation 75C contained similar chemical constituents as 71P but with lower HF level: 800 ppm (75B) vs. 1000 ppm (71P) ammonium bifluoride.

Table 13 has shown the etch rate data for formulation 75B.

TABLE 13

|  | 75C (t0) | 75C (t 2 hrs) | 75C (t 4 hrs) |
|---|---|---|---|
|  |  | Etch Rates (Å/min) |  |
| RIE PVD TiN | 99 | 85 | 100 |
| W | 28 | 10 | 14 |
| ILD | 7 | 6.5 | 9 |

The data in Table 12 has shown that decreasing the HF level in the formulation from 1000 ppm to 800 ppm resulted in a significant decrease in the ILD etch rate, while the W etch rate increased slightly particularly at $t_o$. The TiN etch rate remained high.

Example 13

Addition of Tungsten Corrosion Inhibitor

Formulation 78A containing 200 ppm of a tungsten corrosion inhibitor, polyethyleneimine was used in this example.
Formulation 78A contained a tungsten corrosion inhibitor comparing to formulation 71P.
Table 14 has shown the impact of addition of a tungsten corrosion inhibitor to the formulations.

TABLE 14

|  | 71P (t0) | 78A (t0) |
|---|---|---|
|  | Etch Rates (Å/min) |  |
| RIE PVD TiN | 100 | 80 |
| W | 18 | 6.5 |
| ILD | 7 | 6.5 |

The data in Table 14 has shown that that a W corrosion inhibitor can significantly lower the W etch rates in 71P type formulations without a large impact on TiN etch rate.

Example 14

Suppression of TiN Etch Rate Through Galvanic Coupling to W

An etch study was carried out using the same aqueous formulation 71P shown in Table 1A. The TiN and the W blanket wafer were galvanically coupled to each other before immersing in the formulations. Coupling was achieved by clipping the corners of the wafers together so that a small portion of the tungsten face was contacting a small portion of the TiN face. The thicknesses of the W and TiN wafers were measured before and after etching.

The results showed that the TiN etch rate was high while W etch rate was low for the non coupled system which mimics the etching of the Titanium nitride hard mask in the presence of W.

However, when the TiN and W were galvanically coupled, the etch rates of both the Tin and W were low. This mimics the etching of the TiN liner which was directly in contact with the tungsten on the wafer, in between the W and dielectric.

This example, thus has shown that the formulations of this invention can give high Titanium nitride hard mask etch rates without damaging both the W and the TiN line between the W and low-k dielectric layers.

Working examples have exhibited key features and benefits of present invention.

It is observed that in the absence of Cu(II), use of sufficient quantities of a non-ambient trace oxidant, such as FeCl$_3$ to strip TiN from a minimum bath life of 500 wafers, i.e., 100 ppm, results in very high W etch rates of >100 Å/min. However, the formulations essentially offers no etch/removal selectivity for TiN over W. While, use of much smaller quantities of the non-ambient trace oxidant FeCl$_3$ (non-stoichiometric quantities) can give better TiN/W etch/removal selectivity, but the oxidizing power of these low levels of Fe(III) (20 ppm) is used up quickly, i.e., within the etching of only 50 patterned wafers with TiN hard masks. The oxidizing power is not recovered in air, even after storage overnight.

It is further observed that by adding trace levels of Cu(II) to the formulations, low levels of Fe(III) (20 ppm) and Cu(II) (1-2 ppm) become catalytic with air to etch TiN. Such formulations can etch at least 700 wafers as long as air is present as the ambient oxidizer.

Addition of TiN at levels comparable to the level of Fe(III) to the formulations containing Cu(II) and Fe(III), effectively reduce the Fe(III) to Fe(II) and allow it to be re-oxidized by air in a way that stabilizes the $t_o$ etch rate performance of these formulations giving lower W etch rates in the early stages of heating the formulation in a tool.

Addition of dissolved aluminum to the formulations shows little change in performance and indicates that aluminum build up in the formulation over the course of its bath-life will have little effect on performance.

Addition of trace levels of Nickel (II) to the formulation may help stabilize the etch performance over time.

Without intending to be bound by theory, it is believed that during the etch process the Fe(III) cation is reduced to Fe(II) as the TiN hard mask is oxidized. In the absence of air and Cu(II), the etching process will stop when the Fe(III) cation is used up. In the presence of Cu(II) at low pH the Cu(II) can convert Fe(II) back to Fe(III) and then the resulting reducing Cu(I) is readily converted back to Cu(II) by oxygen in ambient air.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations were not regarded as a departure from the spirit and scope of the invention, and all such variations were intended to be included within the scope of the following claims.

The invention claimed is:

1. A composition for selectively removing titanium nitride (TiN or TiNxOy; where x=0 to 1.3 and y=0 to 2) from a semiconductor device comprising TiN or TiNxOy and a second material selected from the group consisting of Cu, W, low-k dielectric material, and combinations thereof, the composition comprising:
   a weakly coordinating anion having negative charge highly dispersed throughout its structure;
   an amine salt buffer;
   a non-oxidizing trace metal ion;
   a non-ambient trace oxidizer; and
   the remaining being solvent selected from the group consisting of water, sulfolane, dimethyl sulfide, lactic acid, glycol, and mixtures thereof;
   wherein
   the composition is hydrogen peroxide-free;
   the composition is exposed to air;
   the composition has a pH<4; and
   the composition offers a removal selectivity of TiN or TiNxOy vs. the second material >1:1.

2. The composition of claim 1, wherein the weakly coordinating anion is present in a range of 1 to 10 wt % and is selected from the group consisting of: p-toluenesulfonate ($C_7H_8SO_3^-$), sulfate ($SO_4^{2-}$), nitrate ($NO_3^-$), triflate ($CF_3SO_3^-$), fluorosulfate, perfluorosulfonates ($R_fSO_3^-$; where $R_f$ is a perfluoroalkylgroup from C1 to C4), perfluorosulfonimides; $((R_f)_2NSO_2^-$; where $R_f$ is a perfluoroalkylgroup from C1 to C4), hexafluorosilicate ($SiF_6^{2-}$), hexafluorotitanate ($TiF_6^{2-}$), tetrafluoroborate ($BF_4^-$), hexafluorophosphate ($PF_6^-$), hexafluoroantimonate ($SbF_6^-$), perfluoroalkylaluminates (($R_fO)_4Al^-$, $R_f$ is a perfluoroalkyl group), and combinations thereof.

3. The composition of claim 1, wherein the amine salt buffer is present in a range of 0.5 to 10 wt % and is selected from the group consisting of:
   ammonium chloride; ammonium bisulfate; ammonium phosphates; ammonium oxalate;
   ammonium perfluorosulfonates; ammonium tetrafluoroborate; ammonium hexafluorotitanate;
   ammonium hexafluorosilicate; ammonium salts of organic acid selected from ammonium citrate, ammonium acetate, ammonium lactate; and combinations thereof;
   wherein the ammonium having a form of $N(R^1R^2R^3R^4)^+$; wherein $R^1$, $R^2$, $R^3$, $R^4$ is independently selected from the group consisting of H, $CH_3$, $C_2H_5$ and $C_3H_7$.

4. The composition of claim 1, wherein the non-oxidizing trace metal ion is present at <500 ppm, and is selected from the group consisting of:
   Fe(II) ion, Cu(I) ion, Cu(II) ion, Co(II) ion, Cr(II) ion, Mn(II) ion and Ni(II) ion.

5. The composition of claim 1, wherein the non-ambient trace oxidizer is present in a range of 5-200 ppm, and is selected from the group consisting of Fe(III) compounds, Ce(IV), Vanadium (V), Mn(V, VI or VII) compounds, Cr(V or VI) compounds, CI(I, III or V) compounds, Br(I or III) compounds, and combinations thereof.

6. The composition of claim 1 further comprises <4000 ppm solvolyzing bifluoride selected from the group consisting of ammonium bifluoride, alkylammonium bifluorides aqueous hydrogen fluoride, and combinations thereof.

7. The composition of claim 1 further comprises <10000 ppm corrosion inhibitor selected from the group consisting of benzotriazole and substituted benzotriazole, polyethyleneimine, catechol, cysteine and cystine derivative, glycine, thiourea and thiobiuret, siloxane, aluminum chloride, aluminum fluoride, imidazole, triazole, boric acid, and combinations thereof.

8. The composition of claim 1, wherein the non-ambient trace oxidizer is non-stoichiometric and the removal selectivity of TiN or TiNxOy vs. the second material is >10:1.

9. The composition of claim 1, wherein the weakly coordinating anion is hexafluorosilicate, the amine salt buffer is ammonium chloride; the non-oxidizing trace metal ion is $Cu(II)Cl_2$; the non-ambient trace oxidizer is non-stoichiometric $Fe(III)Cl_3$, and the removal selectivity of TiN or TiNxOy vs. the second material is >10:1.

10. The composition of claim 9 further comprises ammonium bifluoride and polyethyleneimine.

11. A system for selectively removing titanium nitride (TiN or TiNxOy, where x=0 to 1.3 and y=0 to 2) from a surface of a microelectronic device, comprising:
   the semiconductor device comprising TiN or TiNxOy and a second material selected from Cu, W, low-k dielectric material and combinations thereof,
   a composition for selectively removing the TiN or TiNxOy from the semiconductor device comprising:
      a weakly coordinating anion having negative charge highly dispersed throughout its structure;
      an amine salt buffer;
      a non-oxidizing trace metal ion;
      a non-ambient trace oxidizer; and
      the remaining being solvent selected from the group consisting of water, sulfolane, dimethyl sulfide, lactic acid, glycol, and mixtures thereof;
   wherein
      the composition is hydrogen peroxide-free;
      the composition is exposed to air;
      the composition has a pH<4; and
      the composition offers a removal selectivity of TiN or TiNxOy vs. the second material >1:1;
   and
   wherein TiN or TiNxOy is in direct contact with the composition and the TiN or TiNxOy is not in direct in contact with W if the second material is W.

12. The system of claim 11, wherein the weakly coordinating anion is present in a range of 1 to 10 wt % and is selected from the group consisting of:
   p-toluenesulfonate ($C_7H_8SO_3^-$), sulfate ($SO_4^{2-}$), nitrate ($NO_3^-$), triflate ($CF_3SO_3^-$), fluorosulfate, perfluorosulfonates ($R_fSO_3^-$; where $R_f$ is a perfluoroalkylgroup from C1 to C4), perfluorosulfonimides; $((R_f)_2NSO_2^-$; where $R_f$ is a perfluoroalkylgroup from C1 to C4), hexafluorosilicate ($SiF_6^{2-}$), hexafluorotitanate ($TiF_6^{2-}$), tetrafluoroborate ($BF_4^-$), hexafluorophosphate ($PF_6^-$), hexafluoroantimonate ($SbF_6^-$), perfluoroalkylaluminates (($R_fO)_4Al^-$, $R_f$ is a perfluoroalkyl group), and combinations thereof.

13. The system of claim 11, wherein the amine salt buffer is present in a range of 0.5-10 wt % and is selected from the group consisting of:
   ammonium chloride; ammonium bisulfate; ammonium phosphates; ammonium oxalate; ammonium perfluorosulfonates; ammonium tetrafluoroborate; ammonium hexafluorotitanate; ammonium hexafluorosilicate; ammonium salts of organic acid selected from ammonium citrate, ammonium acetate, ammonium lactate; and
   combinations thereof;
      wherein the ammonium having a form of $N(R^1R^2R^3R^4)^+$;
      wherein $R^1$, $R^2$, $R^3$, $R^4$ is independently selected from the group consisting of H, $CH_3$, $C_2H_5$, and $C3H_7$.

14. The system of claim 11, wherein the non-oxidizing trace metal ion is in an amount of <500 ppm and is selected from the group consisting of:
   Fe(II) ion, Cu(I) ion, Cu(II) ion, Co(II) ion, Cr(II) ion, Mn(II) ion and Ni(II) ion.

15. The system of claim 11, wherein the non-ambient trace oxidizer is present in a range of 5-200 ppm and is selected from the group consisting of Fe(III) compounds, Ce(IV), Vanadium (V), Mn(V, VI or VII) compounds, Cr(V or VI) compounds, CI(I, III or V) compounds, Br(I or III) compounds, and combinations thereof.

16. The system of claim 11, wherein the composition further comprises <4000 ppm of solvolyzing bifluoride selected from the group consisting of ammonium bifluoride, alkylammonium bifluoride, aqueous hydrogen fluoride, and combinations thereof.

17. The system of claim 11, wherein the composition further comprises <10000 ppm of a corrosion inhibitor selected from the group consisting of benzotriazole and substituted benzotriazole, polyethyleneimine, catechol, cysteine and cystine derivative, glycine, thiourea and thiobiuret, siloxane, aluminum chloride, aluminum fluoride, imidazole, triazole, boric acid, and combinations thereof.

18. The system of claim 11, wherein the non-ambient trace oxidizer is non-stoichiometric and the removal selectivity of TiN or TiNxOy vs. the second material is >10:1.

19. The system of claim 11, wherein the weakly coordinating anion is hexafluorosilicate, the amine salt buffer is ammonium chloride; the non-oxidizing trace metal ion is Cu(II)Cl$_2$; the non-ambient trace oxidizer is non-stoichiometric Fe(III)Cl$_3$, and the removal selectivity of TiN or TiNxOy vs. the second material is >10:1.

20. The system of claim 19, wherein the composition further comprises ammonium bifluoride, and polyethyleneimine.

21. A process of selectively removing titanium nitride (TiN or TiNxOy, where x=0 to 1.3 and y=0 to 2) comprising:
    providing a semiconductor device comprising TiN or TiNxOy and a second material selected from Cu, W, low-k dielectric material;
    contacting the semiconductor device with a composition comprising:
        a weakly coordinating anion having negative charge highly dispersed throughout its structure;
        an amine salt buffer;
        a non-oxidizing trace metal ion;
        a non-ambient trace oxidizer; and
        the remaining being solvent selected from the group consisting of water, sulfolane, dimethyl sulfide, lactic acid, glycol, and mixtures thereof;
        wherein
        the composition is hydrogen peroxide-free;
        the composition is exposed to air; and
        the composition has a pH<4;
    and
    selectively removing TiN or TiNxOy;
    wherein TiN or TiNxOy is in direct contact with the composition and the TiN or TiNxOy is not in direct in contact with W if the second material is W; and removal selectivity of TiN or TiNxOy vs. the second material is >1:1.

22. The process of claim 21, wherein the weakly coordinating anion is present in a range of 1 to 10 wt % and is selected from the group consisting of: p-toluenesulfonate (C$_7$H$_8$SO$_3^-$), sulfate (SO$_4^{2-}$), nitrate (NO$_3^-$), triflate (CF$_3$SO$_3^-$), fluorosulfate, perfluorosulfonates (R$_f$SO$_3^-$; where R$_f$ is a perfluoroalkylgroup from C1 to C4), perfluorosulfonimides; ((R$_f$)$_2$NSO$_2^-$; where R$_f$ is a perfluoroalkylgroup from C1 to C4), hexafluorosilicate (SiF$_6^{2-}$), hexafluorotitanate (TiF$_6^{2-}$), tetrafluoroborate (BF$_4^-$), hexafluorophosphate (PF$_6^-$), hexafluoroantimonate (SbF$_6^-$), perfluoroalkylaluminates ((R$_f$O)$_4$Al$^-$, R$_f$ is a perfluoroalkyl group), and combinations thereof.

23. The process of claim 21, wherein the amine salt buffer is present in a range of 0.5-10 wt % and is selected from the group consisting of: ammonium chloride; ammonium bisulfate; ammonium phosphates; ammonium oxalate; ammonium perfluorosulfonates; ammonium tetrafluoroborate; ammonium hexafluorotitanate; ammonium hexafluorosilicate; ammonium salts of organic acid selected from ammonium citrate, ammonium acetate, ammonium lactate; and combinations thereof;
    wherein the ammonium having a form of N(R$^1$R$^2$R$^3$R$^4$)$^+$;
        wherein R$^1$, R$^2$, R$^3$, R$^4$ is independently selected from the group consisting of H, CH$_3$, C$_2$H$_5$, and C$_3$H$_7$.

24. The process of claim 21, wherein the non-oxidizing trace metal ion is <500 ppm and is selected from the group consisting of:
    Fe(II) ion, Cu(I) ion, Cu(II) ion, Co(II) ion, Cr(II) ion, Mn(II) ion and Ni(II) ion.

25. The process of claim 21, wherein the non-ambient trace oxidizer is present in a range of 5-200 ppm and is selected from the group consisting of Fe(III) compounds, Ce(IV), Vanadium (V), Mn(V, VI or VII) compounds, Cr(V or VI) compounds, Cl(I, III or V) compounds, Br(I or III) compounds, and combinations thereof.

26. The process of claim 21, wherein the composition further comprises <4000 ppm of solvolyzing bifluoride selected from the group consisting of ammonium bifluoride, alkylammonium bifluorides, aqueous hydrogen fluoride, and combinations.

27. The process of claim 21, wherein the composition further comprises <10000 ppm corrosion inhibitor selected from the group consisting of benzotriazole and substituted benzotriazole, polyethyleneimine, catechol, cysteine and cystine derivative, glycine, thiourea and thiobiuret, siloxane, aluminum chloride, aluminum fluoride, imidazole, triazole, boric acid, and combinations thereof.

28. The process of claim 21, wherein the non-ambient trace oxidizer is non-stoichiometric and the removal selectivity of TiN or TiNxOy vs. the second material is >10:1.

29. The process of claim 21, wherein the weakly coordinating anion is hexafluorosilicate, the amine salt buffer is ammonium chloride; the non-oxidizing trace metal ion is Cu(II)Cl$_2$; the non-ambient trace oxidizer is non-stoichiometric Fe(III)Cl$_3$, and the removal selectivity of TiN or TiNxOy vs. the second material is >10:1.

30. The process of claim 29, wherein the composition further comprises ammonium bifluoride, and polyethyleneimine.

* * * * *